United States Patent [19]

McDonald

[11] Patent Number: 5,666,029
[45] Date of Patent: Sep. 9, 1997

[54] FLUORESCENT EMERGENCY BALLAST SELF TEST CIRCUIT

[75] Inventor: Charles W. McDonald, England, Ark.

[73] Assignee: The Bodine Company, Collierville, Tenn.

[21] Appl. No.: 237,572

[22] Filed: May 3, 1994

[51] Int. Cl.$^6$ ................................................. H05B 37/00
[52] U.S. Cl. .......................... 315/86; 315/120; 315/129; 315/91
[58] Field of Search ................................ 315/86, 307, 91, 315/120, 129

[56] References Cited

U.S. PATENT DOCUMENTS

| | | |
|---|---|---|
| 4,550,272 | 10/1985 | Kimura et al. . |
| 4,562,382 | 12/1985 | Elliott . |
| 4,682,078 | 7/1987 | Pascalide . |
| 4,686,424 | 8/1987 | Nuckolls et al. . |
| 4,706,181 | 11/1987 | Mercer . |
| 4,712,153 | 12/1987 | Marget et al. . |
| 4,727,291 | 2/1988 | Bavaro . |
| 4,751,398 | 6/1988 | Ertz, III . |
| 4,799,039 | 1/1989 | Balcom et al. . |
| 4,837,779 | 6/1989 | Lundgren . |
| 4,945,280 | 7/1990 | Beghelli . |
| 4,977,351 | 12/1990 | Bavaro et al. . |
| 5,004,953 | 4/1991 | McDonald . |
| 5,154,504 | 10/1992 | Helal et al. . |
| 5,202,608 | 4/1993 | Johnson . |
| 5,309,350 | 5/1994 | Kijima . |
| 5,489,825 | 2/1996 | Rimmer . |

*Primary Examiner*—Frank Gonzalez
*Assistant Examiner*—Reginald A. Ratliff
*Attorney, Agent, or Firm*—Loeb & Loeb LLP

[57] ABSTRACT

A lighting system composed of: an AC ballast for delivering AC power from an AC power source to a lamp; an emergency power supply for delivering AC power to the lamp when the AC power source fails; and a switch for disconnecting the AC ballast from the AC power source when the AC power source fails.

11 Claims, 11 Drawing Sheets

FLUORESCENT EMERGENCY BALLAST SELF TEST CIRCUIT

BACKGROUND OF THE INVENTION

The present invention relates to luminaires which are supplied with operating power from a primary power source and are equipped with an emergency power source for maintaining lighting for a limited period of time if the primary power source should fail.

In a fluorescent luminaire a ballasting device is required to limit current to the fluorescent lamps. This ballast can be a passive device (e.g. an inductor) or an active circuit that converts the low frequency line voltage input to a high frequency AC output. In addition to the normal AC ballast, another device can be included in the luminaire to provide light for a short period during a loss of line power. This "emergency ballast" is an active circuit that converts energy from a standby power source, such as a rechargeable internal battery, to a voltage and current that is suitable to drive the fluorescent lamp.

Under normal operating conditions, power is provided from power mains to the normal AC ballast to generate light, and to the emergency ballast to maintain a charge on the internal battery. In the event of loss of line voltage, relays in the emergency ballast switch the emergency ballast to the lamp and the circuit provides power to the lamp for a short period, typically 90 minutes.

Since the emergency ballast is not normally operating, it would be desirable to test the ballast periodically to insure that it will function properly when power is lost. This conventionally requires the active intervention of someone to test the device by simulating a power outage and monitoring the operation of the emergency ballast. In many installations this task is neglected and failure of an emergency ballast can only be detected when an emergency situation exists.

SUMMARY OF THE INVENTION

It is an object of the present invention to perform automatic testing of the emergency ballast of such a luminaire.

Another object of the invention is to perform such testing without modifying the emergency ballast or its operation for testing purposes.

A further object of the invention is to simplify the emergency ballast by providing a transistorized inverter cutoff unit.

The above and other objects are achieved, according to the invention, by a lighting system comprising: means for delivering AC power to a lamp from an AC power source; a DC power source constituting an emergency power supply; inverter means connected for producing AC power from a current provided by the DC power source and supplying the AC power produced by the converter means to the lamp when the AC power source fails; and means for deactivating the inverter means when AC power is being delivered to the lamp from the AC power source, wherein the means for deactivating comprise transistorized switch means connected for blocking operation of the inverter means when the AC power source is operational.

Objects of the invention are further achieved by a lighting system comprising: means including an AC ballast for delivering AC power from an AC power source to a lamp; emergency power supply means for delivering AC power to the lamp when the AC power source fails; and switch means for disconnecting the AC ballast from the AC power source when the AC power source fails.

Other objects of the invention are achieved by a method of monitoring the operating condition of a lighting system, which system includes a light producing device capable of producing light in response to an alternating current, circuitry connected to conduct alternating current to the light producing device from a primary power source, a secondary power source providing a direct current, the secondary power source being recharged by the primary power source when the primary power source is operational, an inverter operable to change the direct current from the secondary power source into an alternating current for the light producing device, a circuit unit having an impedance and connected to supply direct current from the secondary power source to the inverter, a circuit connected to conduct alternating current from the inverter to the light producing device, and an on-off switch connected between the primary power source and the light producing device and operable to control delivery of alternating current to the light producing device from the primary power source, the method comprising: (a) periodically performing a first testing procedure, starting from a predetermined time, for testing operation of the secondary power source and the inverter, by: (i) preventing the secondary power source from being charged and operating the inverter to change direct current from the secondary power source to alternating current to the light producing device; (ii) measuring the alternating current being delivered to the light producing device from the inverter, when the inverter is operating, by measuring the potential difference across the impedance of the circuit unit; (iii) determining whether the current measured during the step of measuring the alternating current has a magnitude within a give range, producing a test failure indication when the measured current magnitude is outside the range, manually testing operation of the secondary power source when a test failure indication is produced, and canceling an existing test failure indication when the manually testing step indicates that the, alternating current being delivered to the light producing device has a value within a given range; (iv) measuring the voltage produced by the secondary power source; and (v) causing each occurrence of the first testing procedure to have a duration, wherein a plurality of successive occurrences of the first testing procedure each have a duration with a first value and a subsequent occurrence of the testing step has a duration with a second value longer than the first value; (b) determining whether the light producing device is receiving current from the primary power source at the predetermined time, and when it is determined that the light producing device is receiving current from the primary power source prior the predetermined time, resetting a time later than the predetermined time for starting the first testing procedure; (c) monitoring operation of the switch and, when the switch has been operated in a given manner, terminating the first testing procedure and setting a subsequent time for restarting the first testing procedure; and (d) performing a second testing procedure for monitoring current conducted from the primary power source to the secondary power source and voltage provided by the secondary power source when the secondary power source is being charged by the primary power source. Preferably, the secondary power source is rechargeable from the primary power source, and the second duration value approximates the normal continuous operating lifetime of the secondary power source.

DESCRIPTION OF THE PREFERRED EMBODIMENTS

Figure 1:
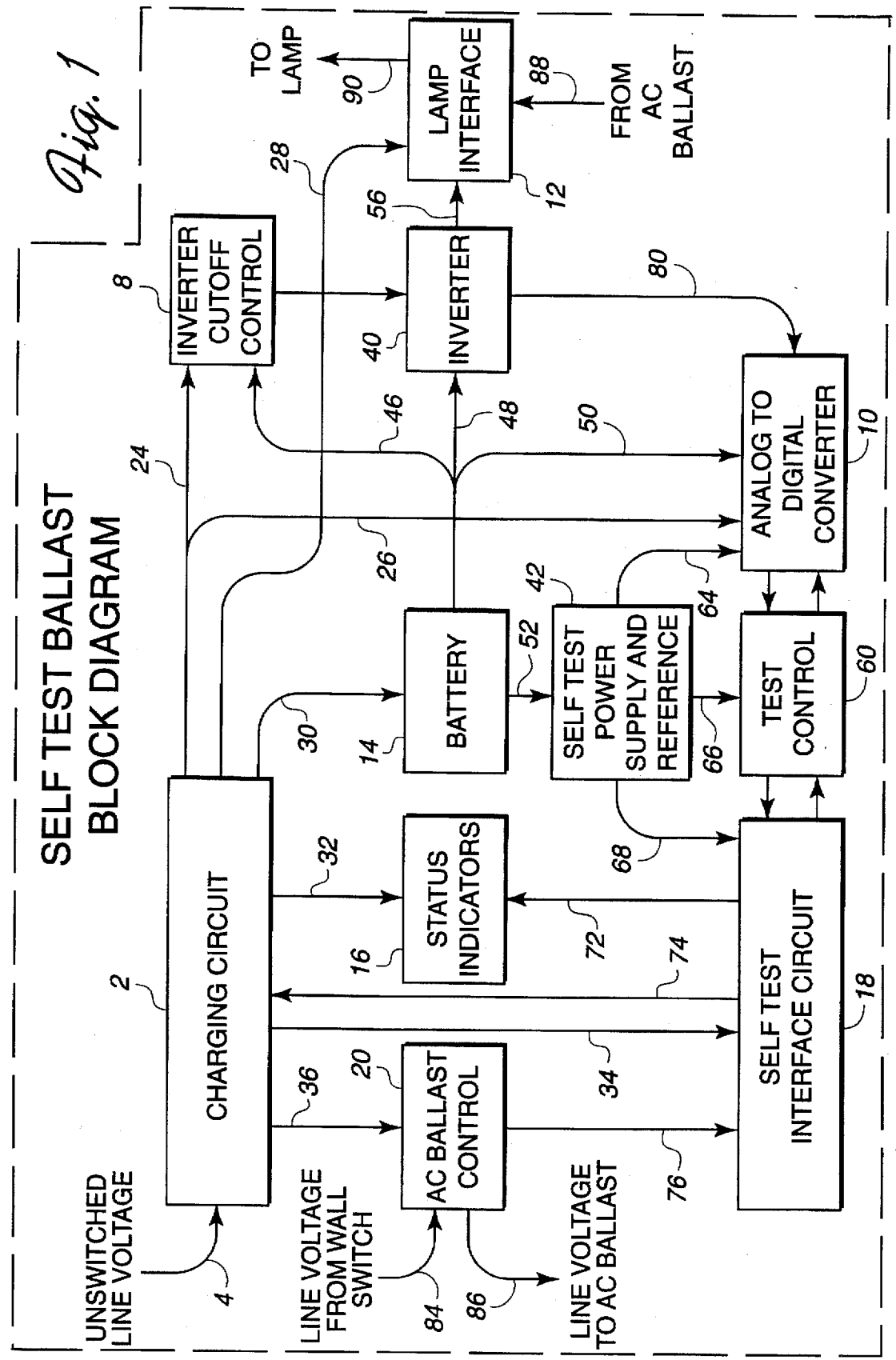
FIG. 1 is a block diagram of an emergency ballast according to a preferred embodiment of the invention.

FIG. 1 is a block diagram showing the arrangement of an emergency lamp ballast according to one embodiment of the invention. The emergency ballast includes a charging circuit 2 connected to the primary power supply for the lamp, such as power mains, via conductors 4. The emergency ballast may be incorporated in a fluorescent luminaire connectable to power mains supplying different voltages. For example the luminaire could contain circuitry allowing it to be connected to a 120 VAC or 227 VAC mains. Charging circuit 2 has an output connected via conductors 24 to an inverter cutoff control 8 and also connected via conductors 26 to an analog-to-digital converter 10. Further outputs of charging circuit 2 are connected to a lamp interface 12, a rechargeable internal battery 14, status indicators 16, a self-test interface circuit 18 and an AC ballast control 20 via conductors 28, 30, 32, 34 and 36, respectively.

Battery 14 is connected to supply a DC operating voltage to inverter cutoff control 8, to inverter 40, to analog-to-digital converter 10 and to a self-test power 30 supply and reference 42 via conductors 46, 48, 50 and 52, respectively. Inverter 40 is connected, via conductors 56, to supply AC operating power to a fluorescent lamp via lamp interface 12. A test control 60 is connected to conduct bidirectional data transfer between analog-to-digital converter 10 and self-test interface circuit 18. Self-test power supply and reference 42 supplies operating power to analog-to-digital converter 10, test control 60 and interface circuit 18 via conductors 64, 66 and 68, respectively. Self-test interface circuit 18 supplies status signals to indicators 16 via conductors 72 and is connected to charging circuit 2 via conductors 74 and to AC ballast control 20 via conductors 76. An analog input to analog-to-digital converter 10 is applied from inverter 40 via conductor 80.

AC ballast control 20 receives power from the primary power source, via conductors 84 which are connected to be operated by a switch, and supplies the line voltage to the AC ballast via conductors 86. Current from the AC ballast is supplied to lamp interface 12 via conductors 88 and operating power, either from the AC ballast or from inverter 40, is supplied by lamp interface 12 to a connected fluorescent lamp via conductors 90.

Figure 2:
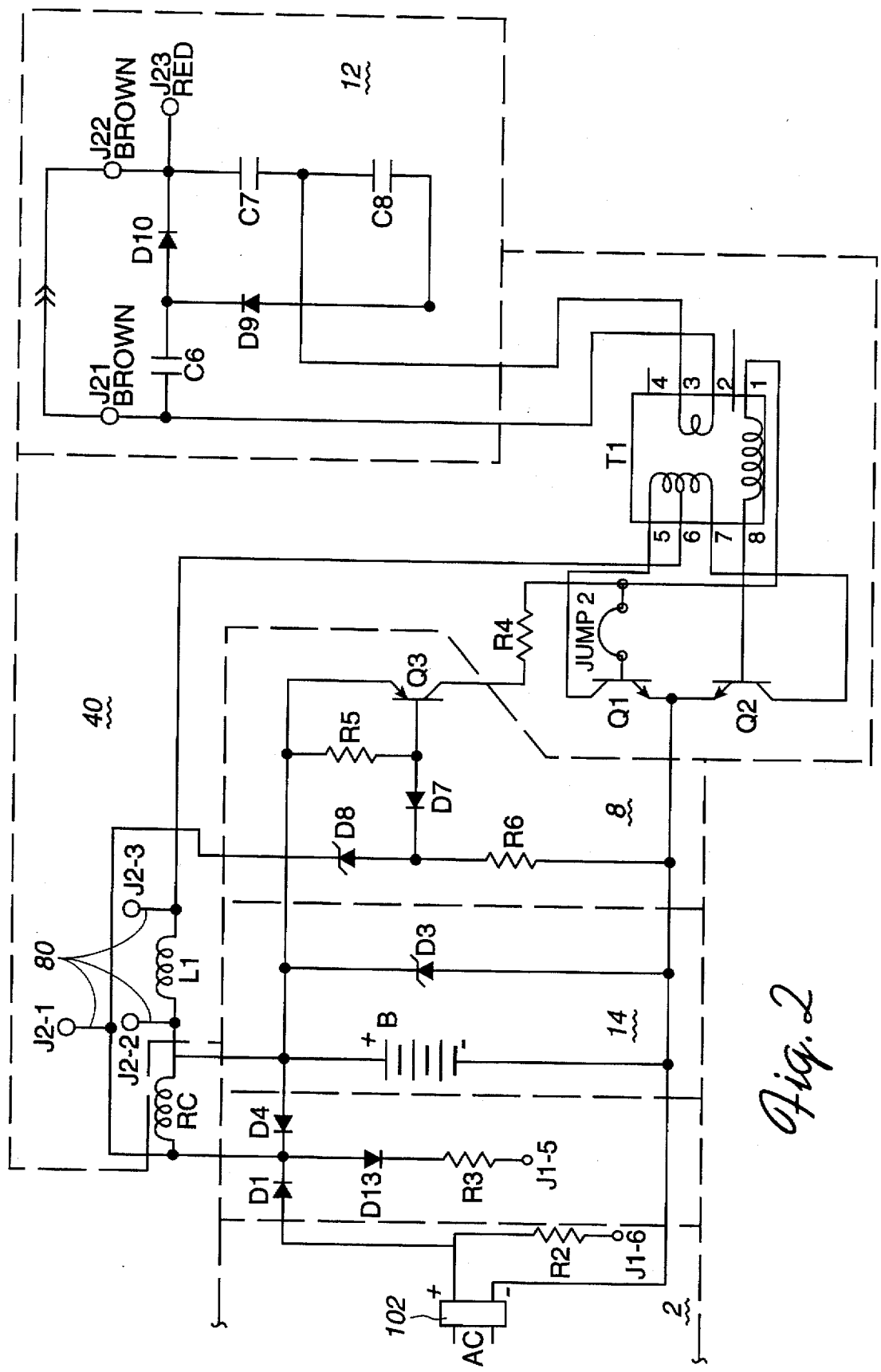
FIGS. 2 and 3 are circuit diagrams of an embodiment of portions of the ballast of FIG. 1.

FIG. 2 shows a portion of the emergency ballast of FIG. 1 containing several novel features of the invention. In particular, the circuit of FIG. 2 includes a novel transistorized embodiment of inverter cut-off control 8, shown connected between inverter 40, on the one hand, and charging circuit 2 and battery 14, on the other hand. In the circuit portion illustrated in FIG. 2, charging circuit 2 includes a rectifier unit 102 which converts AC power from the primary power supply, or mains, into a DC voltage. The DC voltage is employed for charging the storage cells B of battery 14. Circuit 2 has components in addition to those shown in FIG. 2. In particular, circuit 2 includes one or more parallel connected relay coils, represented by one coil symbol RC in FIG. 2, of relays which control connection of the AC ballast to both the power mains and the lamp, depending on whether or not rectifier unit 102 is providing a DC voltage, or charging current.

Inverter 40 is constructed in a known manner and includes a transformer T1 having a secondary which serves as the inverter output and is connected to capacitors of lamp interface 12 to form therewith a resonant circuit which determines the frequency of the output signal produced by inverter 40. Operating power is supplied to inverter 40 from battery 14 via a current supply inductor L1, which is a component normally included in such inverters.

In order for inverter 40 to operate, it is also necessary to supply a drive current to the base of inverter transistor Q1. The supply of drive current is controlled by inverter cut-off control 8.

Inverter cut-off control 8 is composed of an output transistor Q3 having an emitter-collector path connected between the positive terminal of battery 14 and the base of transistor Q1. A resistor R5 is connected between the base and emitter of transistor Q3 and a series arrangement of a rectifying diode D7 and a Zener diode D8, both of which are poled in the same direction, is connected between the base of transistor Q3 and the positive output terminal of rectifier 102. A resistor R6 is connected between the point of connection between diodes D7 and D8 and the negative output terminal of rectifier 102, the negative output terminal also being connected to the negative terminal of battery 14 and to the emitters of inverter transistors Q1 and Q2.

When AC power is being supplied to rectifier unit 102, a DC voltage is produced between the outputs of unit 102. This DC voltage is applied to Zener diode D8 and also produces a direct charging current which flows through diode D1 and relay coil, or coils, RC to the positive terminal of storage cells B. Thus, the charging current actuates the relays containing coils RC to connect the AC ballast to the luminaire wall switch and to the lamp.

The direct charging current does not flow to diode D8 or storage cells B when the AC power mains experience an outage or when the charging current is diverted, or shunted, under control of self test interface circuit 18. For this purpose, the positive output terminal of unit 102 is connected via a resistor R2 to a pin J1-6 which is connected to circuit 18 via a conductor 34 (FIG. 1). Circuit 18 is constructed, in a known manner, to shunt the charging current to ground, via resistor R2, when a test of the emergency ballast system is to be conducted.

When no charge current is being supplied to diode D8 by rectifier 102, a current flow is produced through resistor R6 which provides a sufficient base current for transistor Q3 to saturate that transistor so that the bases of transistors Q1 and Q2 are supplied with base drive current via the conductive collector-emitter path of transistor Q3 and resistor R4. When charge current is being supplied, battery 14 is being charged, the voltage across each relay coil RC causes relay activation and the voltage at the base of transistor Q3 is made sufficiently positive, with the aid of Zener diode D8, to render the collector-emitter path of transistor Q3 non-conducting, removing the base drive current from inverter 40. Diode D7 serves to prevent voltage from reaching self test power supply and reference 42 if the connection between inverter cut-off control 8 and rectifier 102 should be interrupted, as by opening a jumper which may be provided in the circuit pack between the positive output terminal of rectifier 102 and the emitter of transistor Q3. If this situation should arise, diode D7 additionally prevents an excessively high reverse bias voltage from appearing across the base-emitter junction of transistor Q3. However, diode D7 is not necessary for proper operation of circuit 8 and could be eliminated, particularly if circuit 8 is to be employed in a ballast which is not to have any self testing function. The transistorized inverter cut-off control circuit replaces one relay which has been employed in prior art circuits of this type.

Operation of the emergency ballast is, however, controlled by one or more other relays, each having a coil, such as the coil RC, forming part of charging circuit 2. Each relay will be actuated as long as charging current is being supplied to battery 14 by rectifier unit 102.

According to another feature of the present invention, AC ballast control 20 is operative to disconnect the primary power source from the normal, AC ballast, when the primary source has become inactive, i.e. has experienced a failure or outage. Ballast control 20 is operative to interrupt the path of operating current flow between a light switch connected to conductor 84 and lamp interface 12. To perform this function, ballast control 20 may include a relay switch which constitutes a part of the relay containing coil RC and which is closed when an actuating current flows through coil RC.

According to one embodiment of the invention, AC ballast control 20 may contain one of the movable contacts, or poles, of the relay having coil RC. Conductors 84 and 86 are connected to this pole in such a manner that when the relay is not actuated, i.e. when current is not being delivered through coil RC from the output of rectifier 102, the circuit path between conductors 84 and 86 is open. This removes power from the AC ballast when the system is operating in the self test mode.

During the self test cycle, the self test circuit must not only test the battery voltage but must also be able to determine if the external fluorescent lamp is functioning correctly. This test must be performed without interfering with the normal operation of the emergency ballast. Several factors contribute to the difficulty of this measurement.

First of all, the emergency ballast is designed to operate several different sizes and shapes of lamps. The fixture that holds the lamps would therefore be arranged in different configurations and shapes. This makes it difficult and expensive to define an external sensor to monitor the light output from the lamp. The sensor would also be susceptible to interference from other light sources in the vicinity, particularly in multi-lamp fixtures. Other factors include: (1) the ability of the emergency ballast to be remotely located from the lamp; (2) isolation of the emergency ballast inverter transformer secondary from the primary; and (3) high voltages on the secondary of the inverter transformer.

The alternative to using an external sensor is to monitor some internal parameter that would give an effective indication of the external operation. However, this must be done without impeding the emergency ballast circuit in any way. Several parameters were found to vary with the load but only one of these was found consistent enough to provide a good indication of the lamp operation. This parameter is the current into the inverter, which is proportional to the power delivered to the load, excluding a small current that flows even with no load.

The method chosen to measure the current was to determine the voltage drop across the existing primary inductor that feeds the center tap of the inverter transformer primary. This technique assures that no additional power is lost by inserting another resistance in the circuit.

This primary inductor is the inductor L1 shown in FIG. 2. The potential at each side of inductor L1 is supplied via a respective one of test points J2-2 and J2-3 to self test interface circuit 18 via analog-to-digital converter 10. The difference between the potentials at test points J2-2 and J2-3 is representative of the current flowing through coil L1.

Since each of these potentials is relatively high with respect to the potential difference therebetween, the test circuit must have good resolution. In addition, even small variations in component tolerance will introduce errors having a magnitude almost equal to that of the signal to be measured.

To obviate these difficulties, analog-to-digital converter 10 is constructed to perform a conversion which exceeds ten bits of resolution. In addition, test control 60 is operative to compare digital representations of the potentials at test points J2-2 and J2-3 when inverter 40 is not operating. This allows determination of an offset which can be used to compensate for component variations. This also can be subtracted from the readings taken during inverter operation to obtain a more accurate current flow reading. This current flow reading is then compared with preset upper and lower limits to determine whether or not the system is operating properly. In the event of a reading which indicates a test failure, an appropriate indication will be provided by status indicators 16.

In addition, test point J2-2 is connected to analog-to-digital converter 10 to permit digital values representative of the potential at the positive side of battery 14 to be generated for test purposes. The difference in potential between points J2-2 and J2-1 constitutes the voltage across each relay coil RC. In the charge mode, charge current is determined by measuring the voltage drop across the relay coil. The battery voltage is subtracted from the value at the positive side of the coil to find the difference voltage. This is then compared to the preset limits. No offset compensation is required for this quantity due to the relative magnitude of the voltages.

A failure in the charge current indicates either excessive or insufficient charge current. Excessive charge current would result in the premature failure of the relay coils. The self test circuit is designed to give an immediate indication of this condition when it occurs so that it can be corrected. Typically this can only occur at the time of installation. A failure of this parameter requires quick correction so the buzzer "SP1" and LED "D13" both operate at half second intervals, to indicate the urgency of the condition, until the problem is corrected.

The potentials at points J2-1, J2-2 and J2-3 are all measured relative to the potential at the negative terminal of storage cells B.

Figure 3:
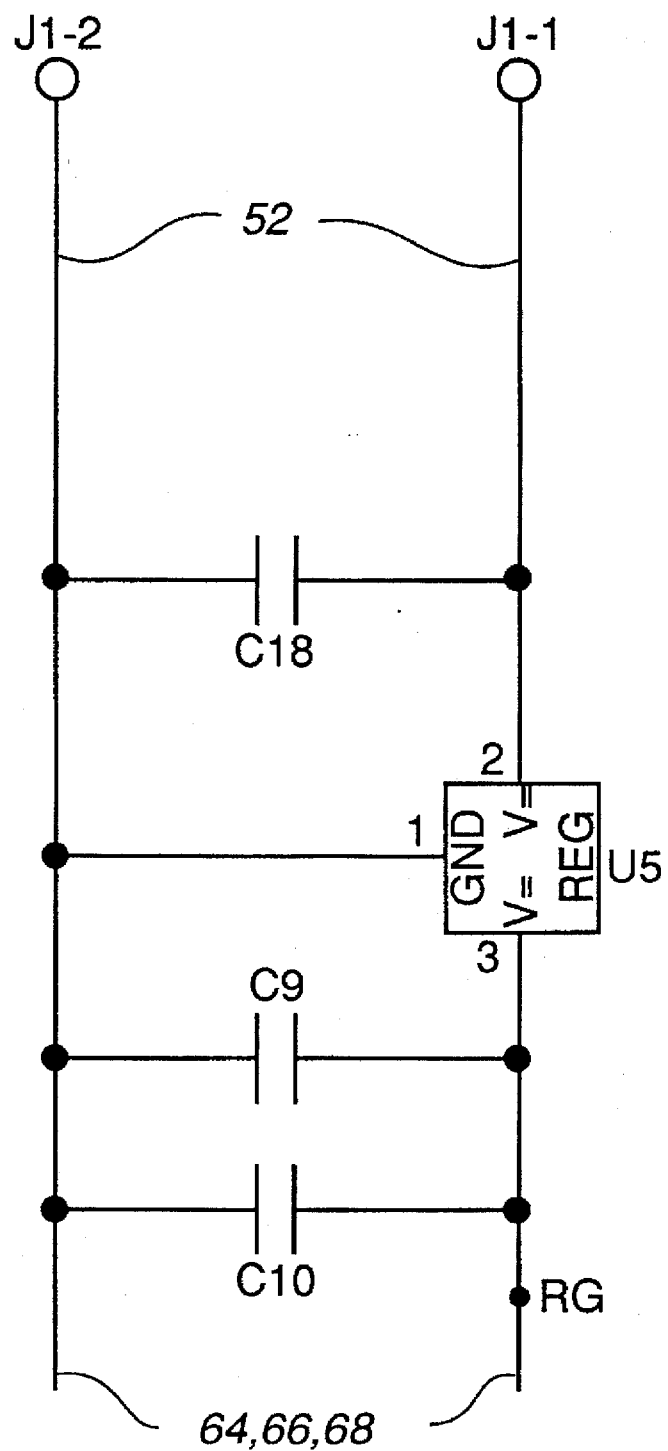

According to a further feature of the invention, self test power supply and reference 42 is connected to derive a regulated voltage from the voltage provided by battery 14. One embodiment of unit 42 is shown in FIG. 3. This unit is constituted by a simple circuit composed of smoothing capacitors and a conventional voltage regulator, as shown.

Test control 60 is a programmed digital device which is constructed according to conventional techniques to control all automatic test operations. The function of test control 60 is to automatically initiate tests and monitor the performance of the emergency ballast on a predetermined schedule. The tests may be performed, for example, every 30 days with a test time of 32 seconds, and during every 12th test the test time is extended to 90 minutes. The status of the results is then reported to the occupants via a light emitting diode (LED) and a buzzer. Continuous monitoring of battery voltage and charge current while in the charge mode also provides an indication of correct installation and operation. Since the emergency ballast is designed with dual voltage capability, an out of range charge current could indicate connection to the wrong supply lead. An out of range battery voltage would be indicative of a failure in at least one cell of a multi-cell battery pack B.

Testing procedures according to the invention will now be described in greater detail. By way of introduction, testing according to the invention involves monitoring of the voltage applied to the AC ballast to determine whether the system is in use. This can be achieved by monitoring a signal delivered via a conductor 76 from AC ballast control 20 to interface circuit 18 (FIG. 1). If the system is not in use, the wall switch connected to AC ballast control 20 will be in its open state. If the system is in use, i.e. if the wall switch is closed and AC voltage is being applied to the AC ballast, the test is initially rescheduled. However, when a certain period of time has passed after an initially scheduled test time, the test will be automatically initiated. At this time, circuit 18 will be operated to shunt the charging current from rectifier unit 102 even if the wall switch is closed.

A test can be terminated by an individual by cycling the light switch in a selected on-off pattern. For example, an occupant present in the area can terminate the test by cycling the light switch with a 2 to 8 second interval between transitions of power to the light (e.g. turn the light switch off, wait 5 seconds and then turn the light switch back on). When the self test circuit receives this signal, it reschedules the test for eight hours later.

In the event of a test failure, the failure indication would normally continue until the next test cycle. This indication can be reset if the result from a 10 second or longer manual test indicates that the emergency ballast is operative. For example, if the fluorescent lamp had failed prior to the self test cycle and the self test circuit detected this, the lamp can be replaced and manually tested to reset the fail indication. A manual test is performed by actuating an external switch that removes line power from the emergency ballast, i.e. from charging circuit 2.

A test in accordance with the invention includes two phases: for testing emergency mode operation, the system is placed in the emergency operating state, in a manner as described above, in which case the current through inductor L1 and the voltage across battery 14 are measured.

Testing in the charging mode involves measuring the potential difference across coil RC in order to provide an indication of charge current.

For the start of testing, a reset vector may be generated to start the testing program, followed by an initializing routine and a testing to determine whether a RAM is in a state suitable for storing measured data.

After the RAM has been initialized, and is thus ready for further use, timer and interrupt control flags are set and an inquiry is made as to whether the time has arrived for effecting an A to D conversion and, if so, the conversion is performed. For any operating mode of the self test circuit, A/D conversion of measured values is effected in the following sequence: reference voltage, discharge current, battery voltage and charge current.

Then a determination is made as to whether all conversions are complete.

Figure 4:
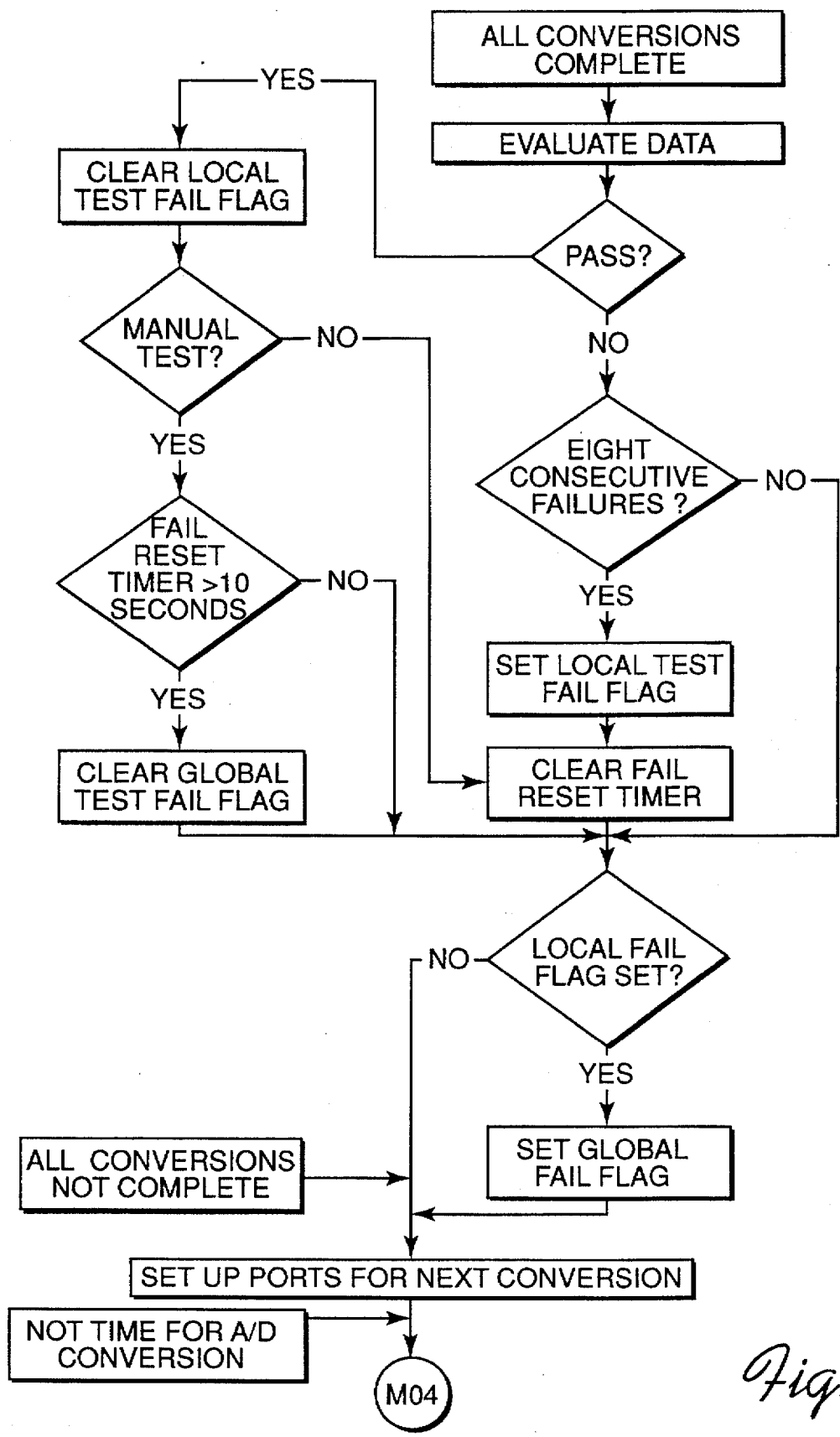
FIGS. 4–11 are flow diagrams illustrating a test procedure according to the invention.

The operations performed in response to this latter decision are illustrated in the flow diagram of FIG. 4.

As shown in FIG. 4, if it is indicated that all conversions are complete the converted data is evaluated. If it is determined that the data shows that the self test has passed, then the local test fail flag is cleared, and an inquiry is made as to whether a manual test is to be performed. If the manual test is to be performed, a determination is made of whether a fail reset timer has reached a time of greater than 10 seconds. If it has, a global test fail flag is cleared.

If the data indicates that the system has not passed the self test, an inquiry is made as to whether 8 consecutive failures have been observed. If the response is yes, a local test fail flag is set and the fail reset timer is cleared. If 8 consecutive failures have not occurred, or if the fail reset timer has not reached ten seconds, or if the global test fail flag has been cleared, an inquiry is made as to whether the local test fail flag has been set. If so, the global test fail flag is set; otherwise, or when it has been previously indicated that all conversions are not complete, I/O ports of test control 60 are set up for the next conversion under program control. Each of the four potentials to be measured is compared to a ramp with a compensation for each. Four comparators are each connected to a respective I/O port. Since the comparators are open collector and use external pull up resistors, the comparators can be turned off by holding the I/O ports low, employing a wired OR configuration. In order to select one port for A/D conversion, that port is configured for input, while the other three ports are configured for output and are in a low state. Only the input port is allowed to generate a signal that can be recognized by the program.

Figure 5:
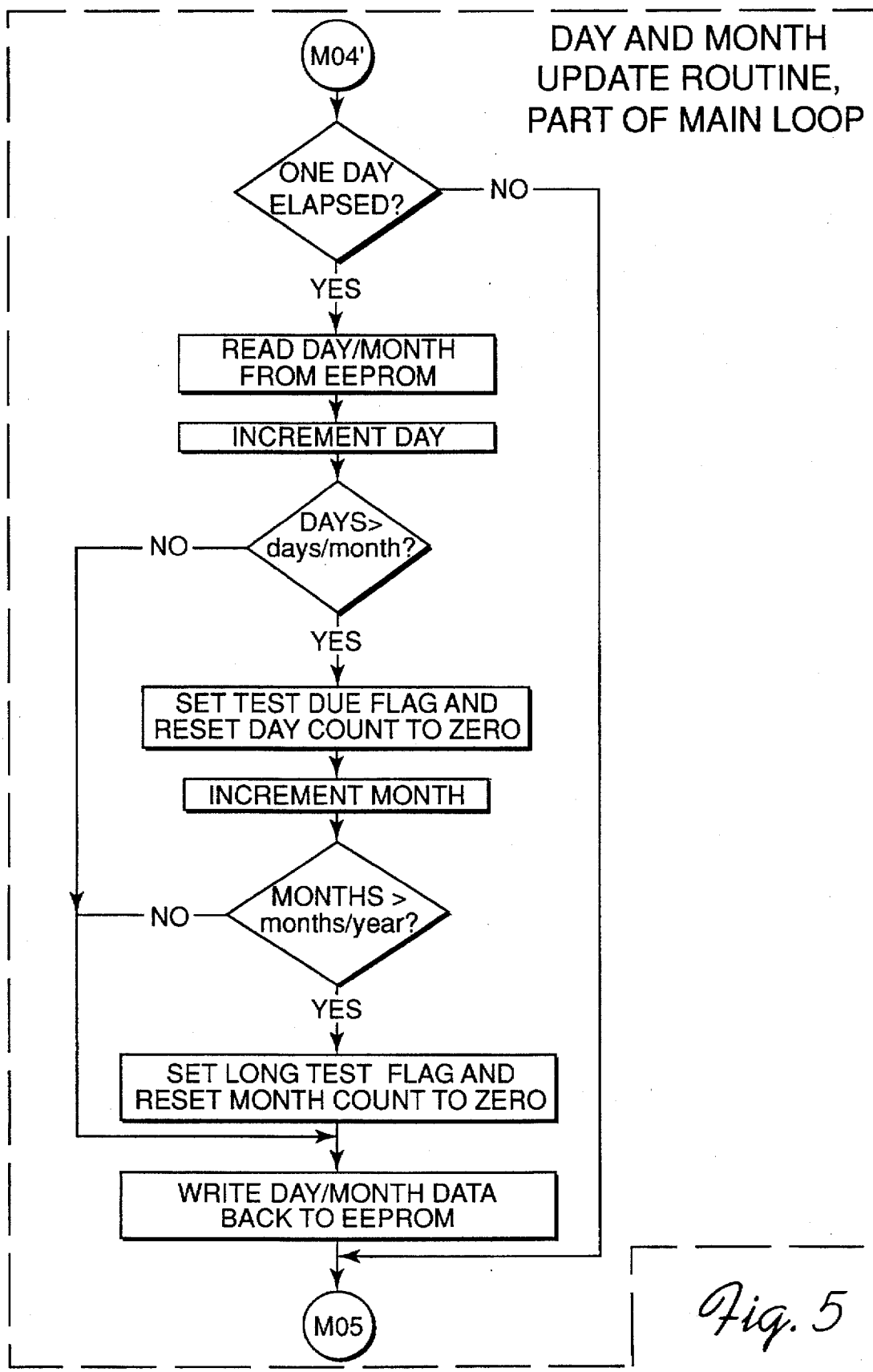

After the ports are set up for the next conversion, or if it was previously indicated that it is not yet time for A/D conversion, the procedure illustrated in the flow diagram of FIG. 5 is carried out. In this operation, a determination is made as to whether a day has elapsed. If the determination is yes, the day and month are read from an EEPROM in test control 60, which is incremented by one day, and a determination is made as to whether the number of days stored is greater than the number of days in the month. If the response to this inquiry is positive, a test due flag is set and the day count is reset to zero, followed by incrementing the stored month. A determination is made as to whether the number of stored months is greater than the number of months in a year and if the response is positive, a long test flag is set and the month count is reset to zero. Then, the day/month data is written back into the EEPROM.

However, the entire operation described above is bypassed if it is determined that one day has not elapsed. If the determination of whether the number of incremented days is greater than the days in the month is negative, the operations up to writing the day/month data are bypassed, while if it is determined that the number of incremented months being stored is not greater than the total number of months in a year, the setting of the long test flag and the resetting of the month count to zero are bypassed. The operation shown in FIG. 5 is essentially a day and month update routine.

At the end of this routine, there is performed an initiate test routine, which includes the following steps, performed in the order described:

- an inquiry is made as to whether testing is already being performed. If the response to this inquiry is positive, the initiate test routine is ended;
- the following three inquiries are made: whether a test is due, whether a four second counter has reached 32 seconds and whether the battery is at full charge. A four second counter produces an output count representing the number of four second intervals counted. If the response to any one of these inquiries is negative, the initiate test routine is ended;
- if the response to all three inquiries is positive, a determination is made of whether the AC ballast has been off for more than two hours. If the determination is negative, a determination is made of whether the previously scheduled test is three days overdue. If the response to this inquiry is negative, the initiate test routine is completed;

if it is determined that the AC ballast has been off for more than two hours or the test is three days overdue, any previous fail flags are reset and test flags are reset.

Then, an inquiry is made as to whether the test to be performed is a long test, e.g. a 90-minute test that may be performed approximately annually. If the indication is negative, the initiate test routine is completed; if it is positive, the test time counter is set for 90 minutes.

Figure 6:
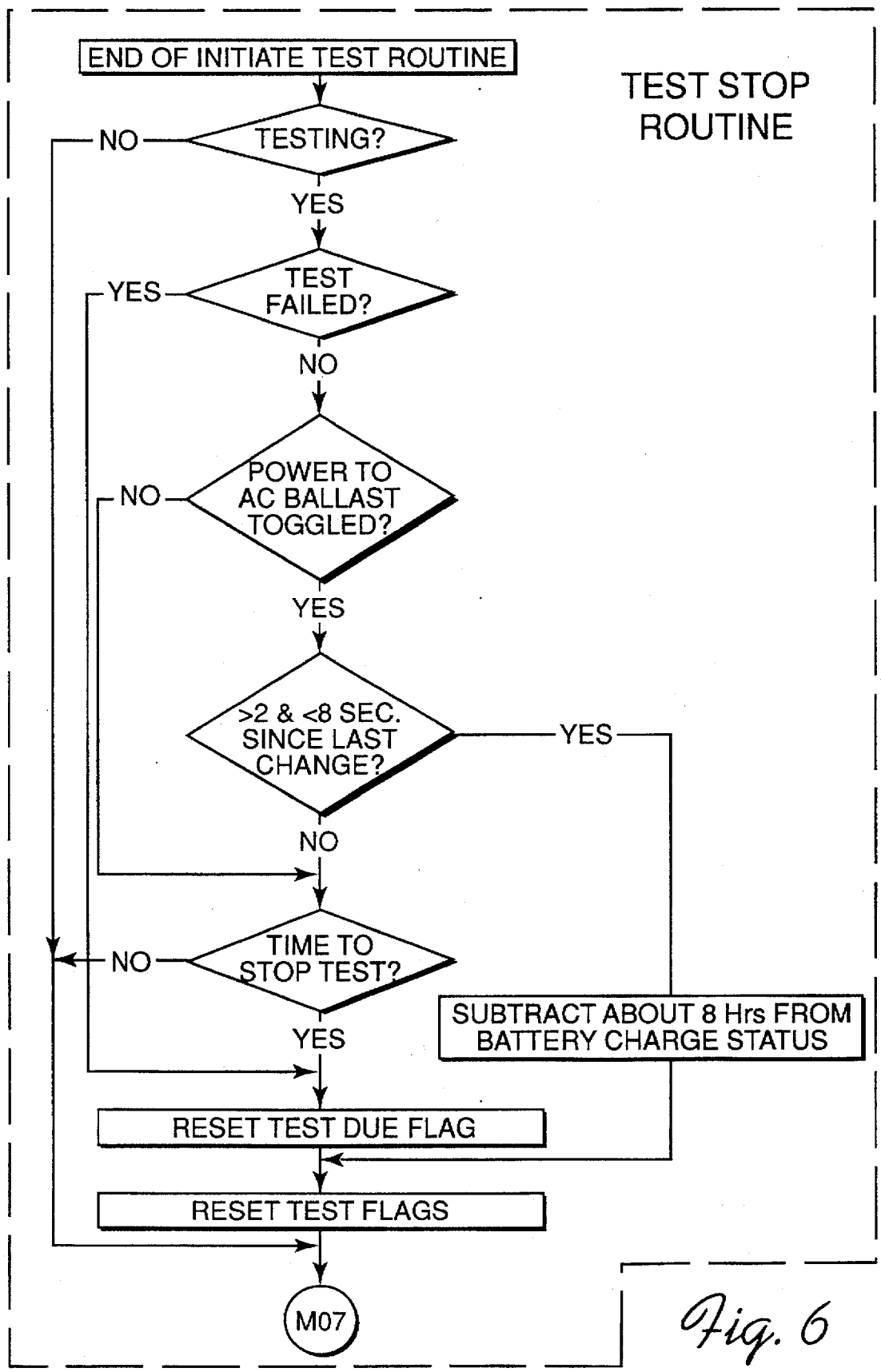

After the initiate test routine has been completed, the test stop routine is performed, as shown in FIG. 6. First, it is determined whether testing is being performed. If testing is not being performed, the test stop routine is completed. If testing is being performed, inquiry is made as to whether the test has been failed. In the response to this inquiry is positive, a test due flag and test flags are reset and the test stop routine is completed. If there is an indication that the test has not failed, an inquiry is made as to whether power to the AC ballast has been toggled, i.e. by manual operation of an associated switch for controlling delivery of power to ballast control 20. If the response to this inquiry is positive, a determination is made as to whether the time since the last change in switch state is greater than two seconds and less than eight seconds. If the response to this inquiry is negative, or if the response to the inquiry as to whether power to the AC ballast has been toggled is negative, an inquiry is made as to whether it is time to stop the test. If the response to this inquiry is negative, the test stop routine is ended. If the response to the inquiry as to whether it is time to stop the test is positive, then, again, the test due flag and the test flags are reset and the test stop routine is completed. Finally, if it is indicated that the power to the AC ballast has been toggled for between two and eight seconds, eight hours is subtracted from the battery charge status, the test flags are reset, and the test stop routine is completed. As noted previously herein, delivery of power to the AC ballast is effected by closing a line switch and the state of that switch can be determined on the basis of a signal from AC ballast control 20 to interface 18 via a conductor 76.

After completion of the test stop routine (M07) a routine is performed to operate status indicators 16. This routine is not illustrated by a flow diagram but will be described in detail below. It will be assumed here that the status indicators include one visual indicator, such as an LED, and one audible indicator, such as a horn.

In this routine, it is first determined whether testing is being performed and whether battery 14 is being charged. If it is determined that neither of these events is occurring, the LED and horn are turned off. If both testing and charging are occurring, inquiry is made as to whether a failure has been detected. If a failure has not been detected, the horn is turned off. If a failure has been detected, inquiry is made as to whether the time has arrived for turning the LED and the horn off. If the response to this inquiry is positive the LED and the horn are turned off. If the response is negative, inquiry is made as to whether a level two failure has occurred. A level two failure is any detected failure other than that relating to undercharging or overcharging of battery 14.

Operation of the LED and the horn must be periodic. To control this operation, use is made of the frequency of the AC power from the mains as a basic unit of time. This frequency is sensed by a microcontroller in test control 60 in which counters are created under program control to provide indications of elapsed time. The first of these counters counts each AC cycle and this counter is designated the sub-second counter. This counter is set to produce a maximum count of 240, after which it is reset to a count of zero.

For a 60 Hz voltage, this counter will reach its maximum count once every four seconds. Each time this counter is reset from its maximum count to zero, it advances the count being produced by a second counter by an increment of one. This second counter is designated as a four second counter.

Specific count values produced by the four second counter can be employed to trigger periodic events.

Figure 7:
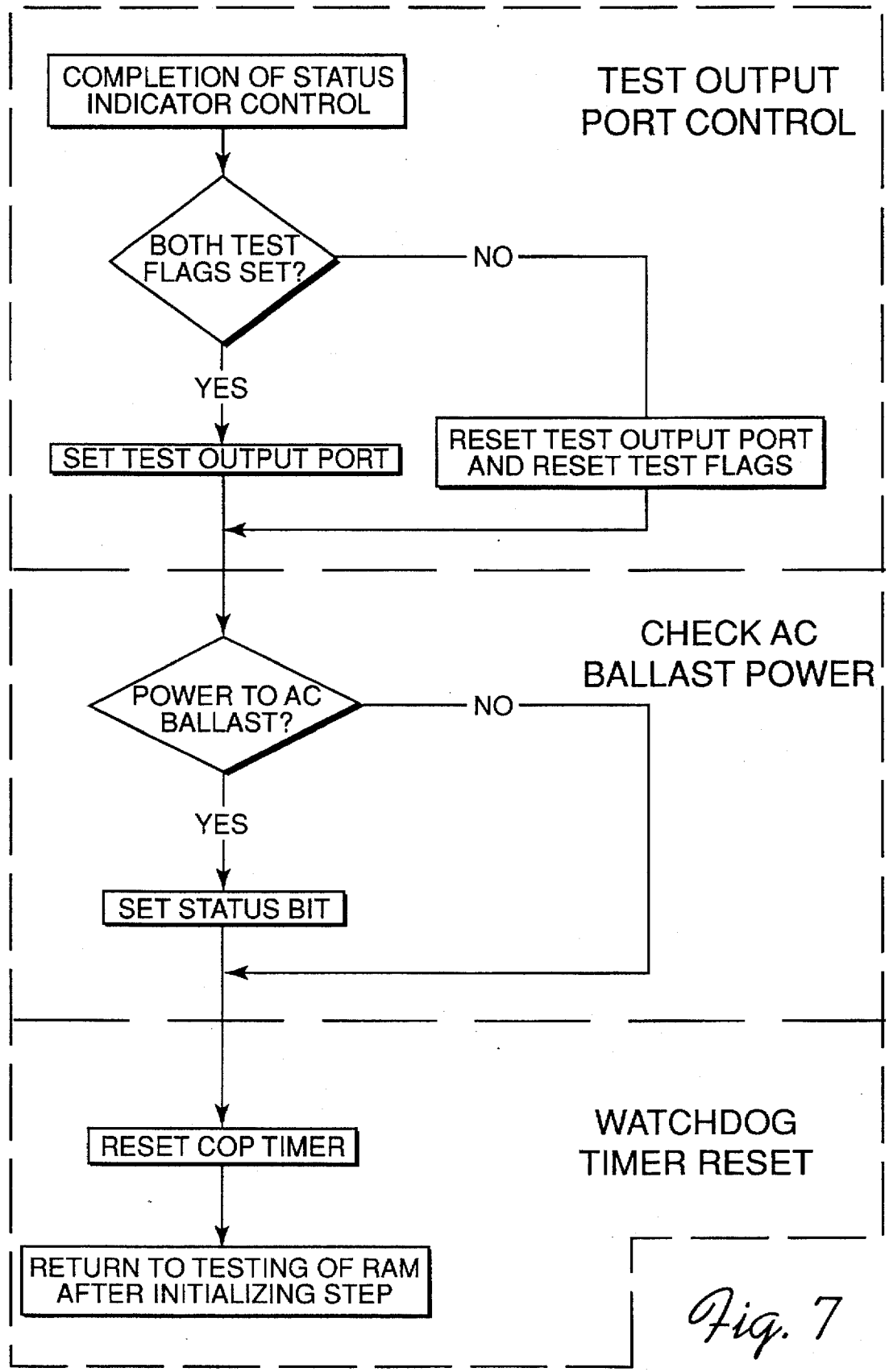

The sub-second counter produces the basic operating rate for the LED and the horn. In the event of what is termed a level one failure, which is a failure represented by overcharging or undercharging of battery 14, the LED and the horn produce coincident outputs. In the event of a level two failure, the horn is controlled to produce an audible output for a period of four seconds once every 32 seconds. The three least significant bits of the four second counter output are used to generate the signal for operating the horn. In order for the horn to be operated, the correct bit pattern must be produced by both the sub-second counter and the four second counter. Reverting to the routine to operate status indicator 16, if the response to the inquiry of whether a level two failure has occurred is positive, the horn is turned on, while if the response to that inquiry is negative, an inquiry is made as to whether the four second counter has reached a count of 32 seconds. If the result of this inquiry is positive the horn is turned on, while if the response is negative, the LED is turned on. Thereafter, or after the LED and the horn have been turned off, operation proceeds to a test output port control routine, which is illustrated in FIG. 7. First an inquiry is made as to whether both test flags have been set. If the response is positive, the test output port is set, while a negative response leads to resetting the test output port and the test flags. After either result has been achieved, an inquiry is made as to whether power is being supplied to the AC ballast. If the response is positive, the status bit is set, while if the response is negative, resetting of the status bit is bypassed. In either event, operation passes to resetting of a cop (computer operating properly) timer which is a timer conventionally provided in microcontrollers to prevent programs from entering endless loops.

Then, operation returns to approximately the start of the program, at the previously described step in which the status of the RAM is determined.

Figure 8:
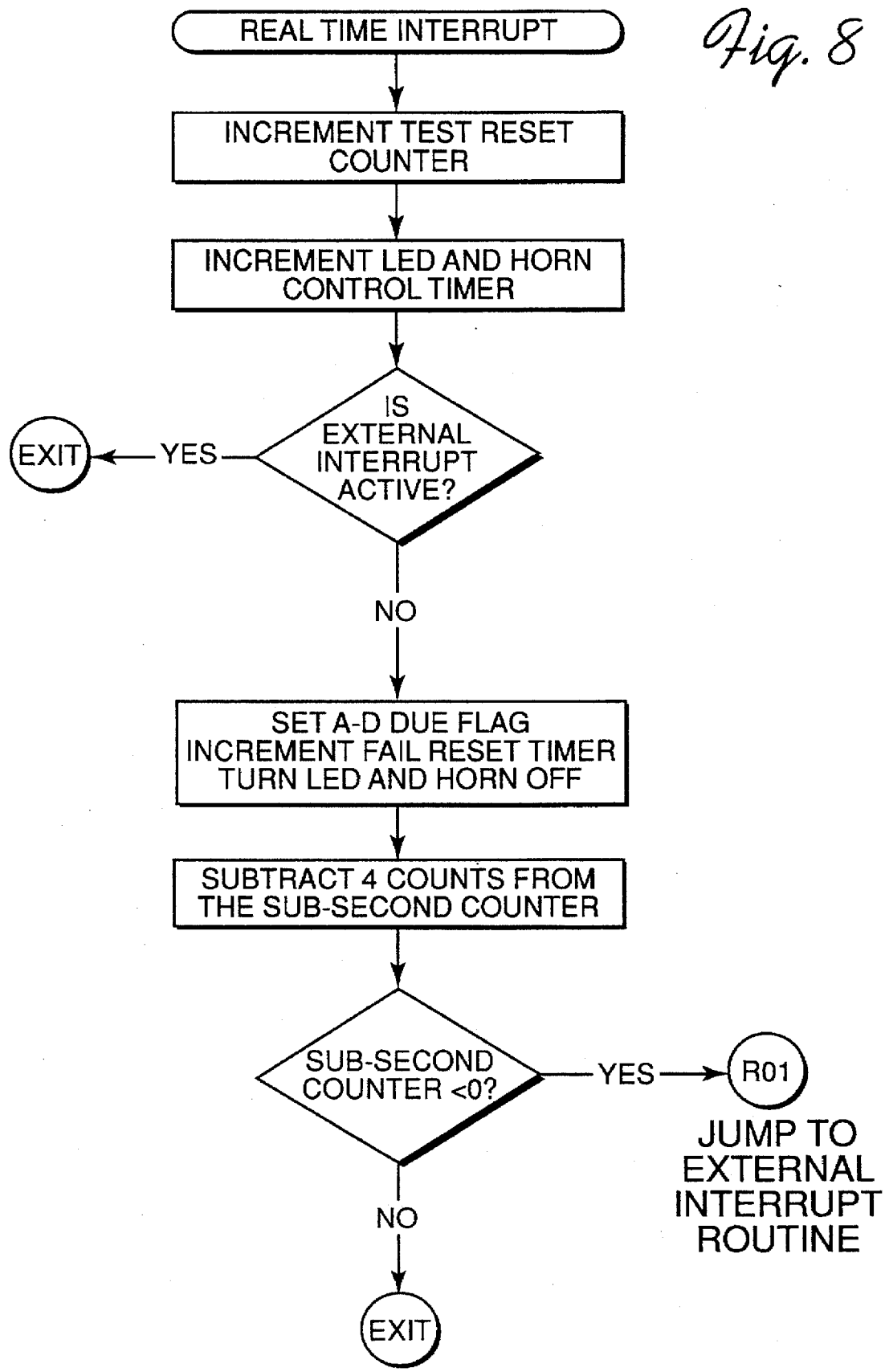

Testing procedures according to the invention further include several interrupts. The first interrupt, shown in FIG. 8 is a real time interrupt. A real time interrupt is one of two interrupts which can be generated by a free running timer in a microcontroller. The real time interrupt rate is determined by the processor clock frequency and two rate select bits. For example, in the practice of the present invention, such interrupt can be made to occur once every 65 ms. The interrupt is used to keep track of all timing functions when there is no external interrupt signal. In this operation, as shown in FIG. 8, the test reset counter is incremented, the status indicator control timer is incremented and an inquiry is made as to whether an external interrupt is active. If the result is positive, the routine is halted, while if the response is negative, an analog/digital converter due flag is set, a fail reset timer is incremented and the status indicators are turned off. Then, four counts are subtracted from a sub-second counter, after which an inquiry is made as to whether the setting of the sub-second counter is less than zero. If the response to that inquiry is positive, the program jumps to an external interrupt routine, to be described below, while if the response is negative, the real time interrupt is exited.

Figure 9:
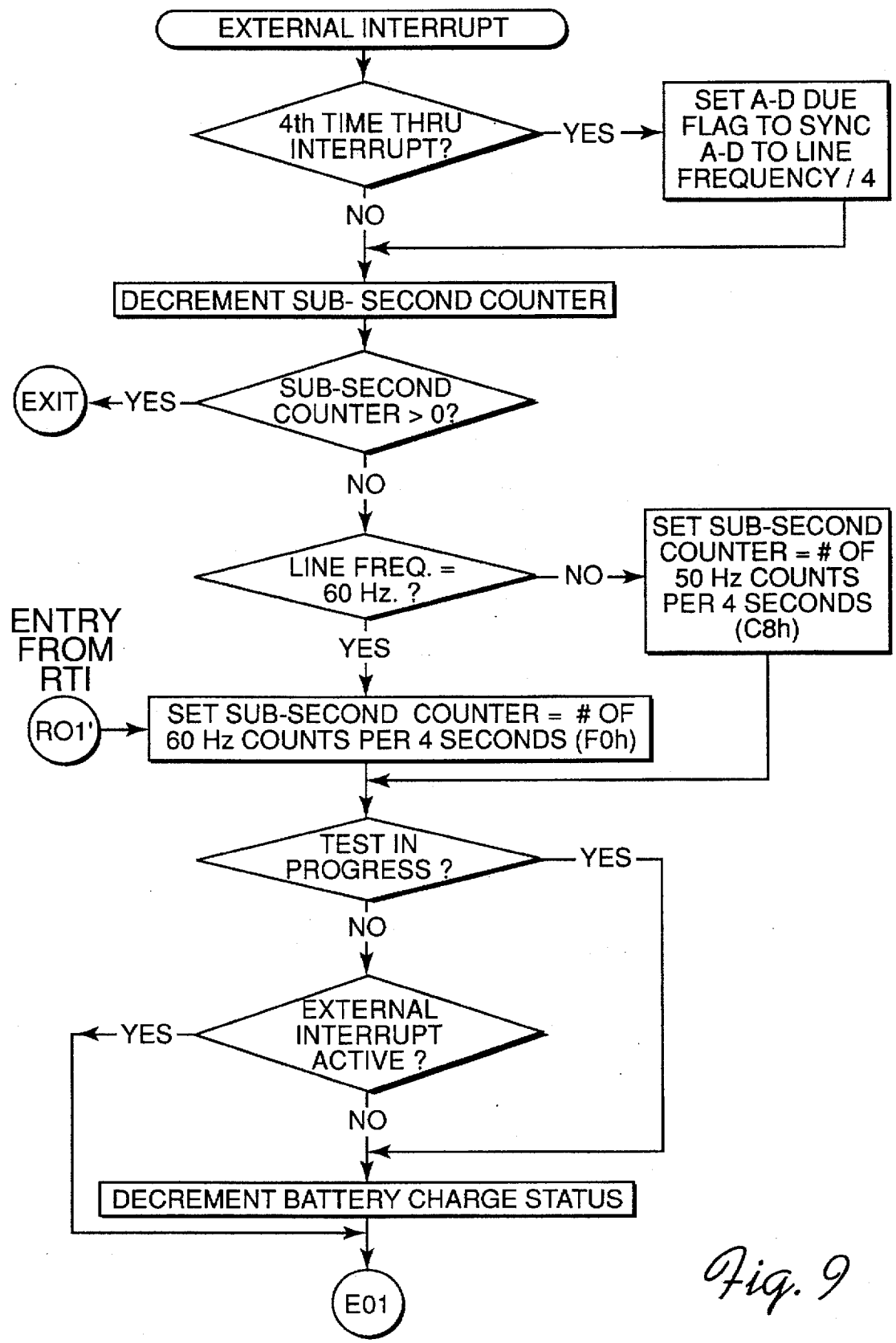
Figure 10:
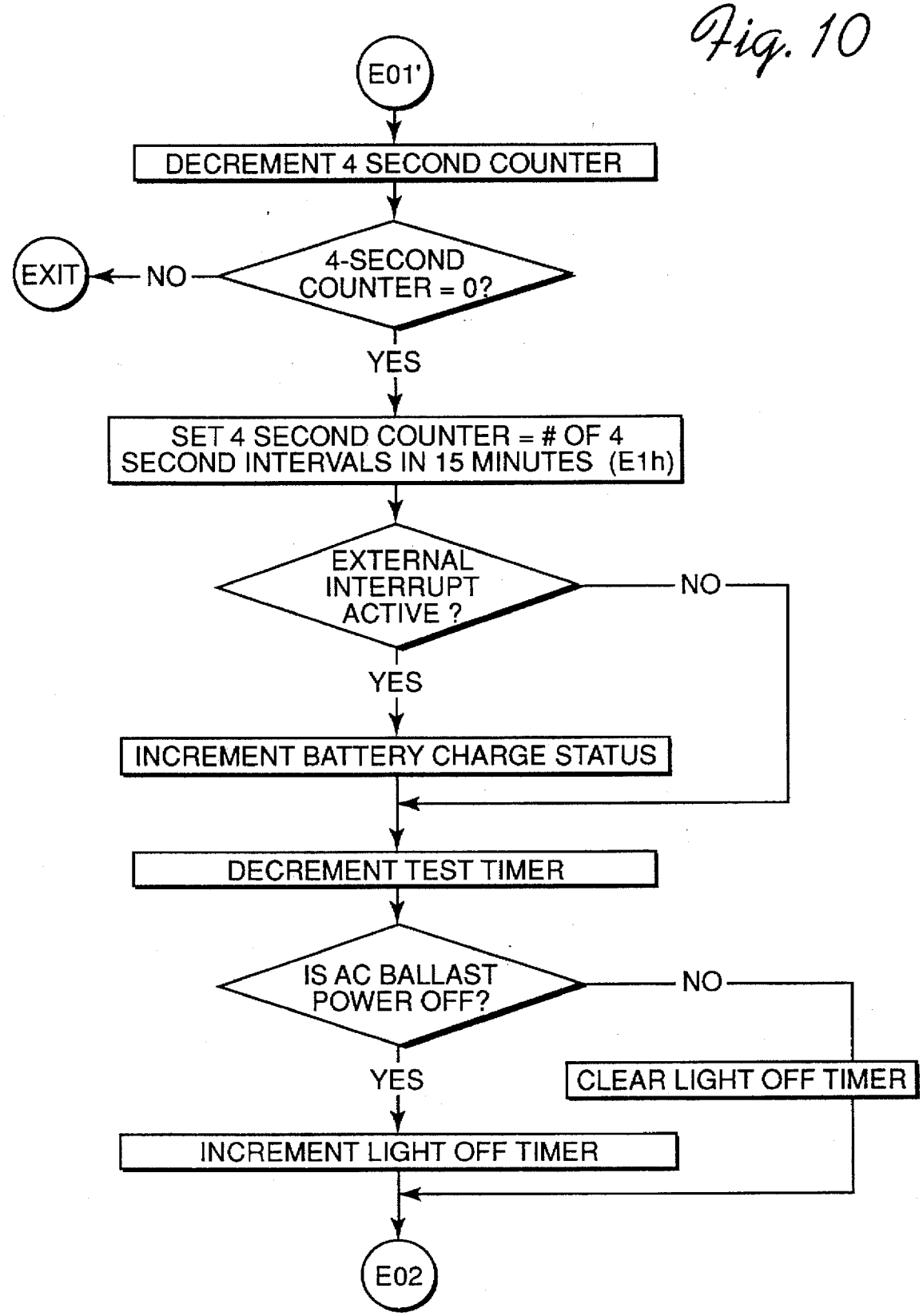
Figure 11:
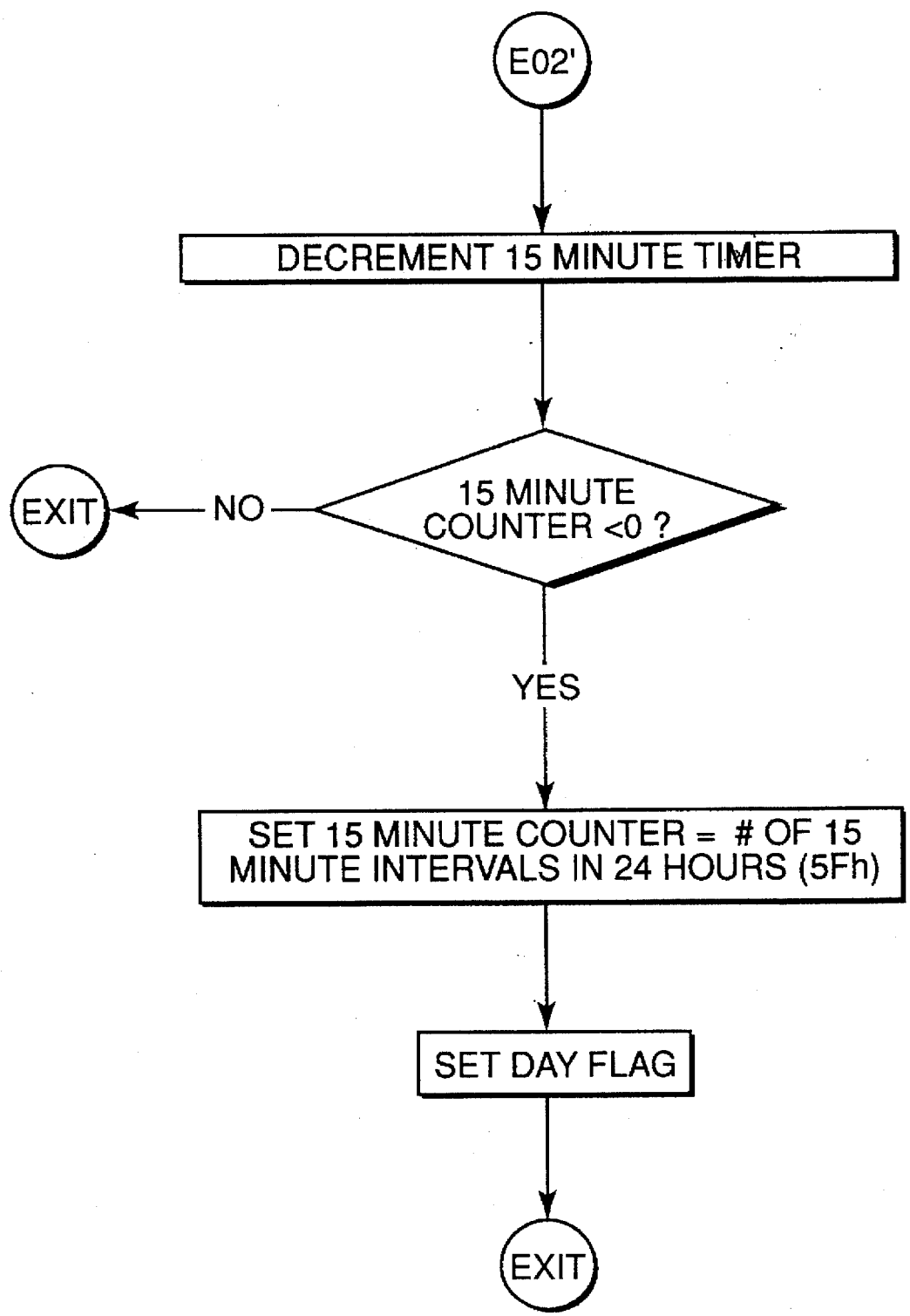

The external interrupt routine is illustrated in FIGS. 9, 10 and 11.

When the external interrupt is initiated, an inquiry is made as to whether this represents the fourth time that the interrupt has been entered. If the response is positive, the analog-digital converter due flag is set to synchronize the analog digital converter to one fourth the line frequency. Then, operation proceeds to decrement the sub-second counter and inquiry is made as to whether the sub-second counter reading is greater than zero. If the response is positive, the external interrupt routine is exited. If the response is negative, inquiry is made as to whether the line frequency equals 60 Hz. If the response to that inquiry is negative, the sub-second counter is set to equal the number of 50 Hz counts per four seconds; if the response is positive, the sub-second counter is set to the number of 60 Hz counts per four seconds and the routine is entered from the real time interrupt. Then, an inquiry is made as to whether a test is in progress and if the result of this inquiry is negative, an inquiry is made as to whether the external interrupt is active. If the external interrupt is active, operation proceeds to the steps shown in FIG. 10. If a test is in progress or the external interrupt is not active, the battery charge status is decremented and operation also proceeds to the steps shown in FIG. 10.

Referring to FIG. 10, the four second counter is decremented and an inquiry is made as to whether the four second counter has reached a count of zero. If the response is negative, the external interrupt is exited. If the response is positive, the four second counter is set to the number of four second intervals in 15 minutes. Then an inquiry is made as to whether the external interrupt is active. If the response is positive, the battery charge status is incremented and then one proceeds to decrement the test timer. If the response is negative, the operation proceeds directly to decrementing the test timer. Then inquiry is made as to whether the AC ballast power is off. If the response is positive, a light off timer is incremented, while if the response is negative, the light off timer is cleared. The light off timer is also provided in the microcontroller and is operative to delay a test until two hours after the lamp has been turned off.

Operation then proceeds to the steps shown in FIG. 11, which includes decrementing the 15 minute timer and inquiring whether the 15 minute counter has reached a value less than zero. If the determination is negative, the external interrupt is exited, while if the response is positive, the 15 minute counter is set to the number of 15 minute intervals in 24 hours. The day flag is then set and the external interrupt is exited.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed:

1. A method of monitoring the operating condition of a lighting system, which system includes a component capable of producing light in response to an alternating current, circuitry connected to conduct alternating current to the component from a primary power source; a secondary power source providing a direct current, an inverter operable to change the direct current from the secondary power source into an alternating current for the component and a circuit connected to conduct alternating current from the inverter to the component, said method comprising:

testing operation of the secondary power source and the inverter by:

operating the inverter to change direct current from the secondary power source to alternating current to the component; and measuring the alternating current being delivered to the component from the inverter;

wherein the system further includes a circuit unit having an impedance and connected to supply direct current from the secondary power source to the inverter, and said step of measuring the alternating current is performed by measuring the direct current supplied by the circuit unit.

2. A method as defined in claim 1 wherein the direct current is measured by measuring the potential difference across the impedance of the circuit unit.

3. A method as defined in claim 1 wherein said testing step further comprises measuring the voltage produced by the secondary power source.

4. A method as defined in claim 1 wherein the direct current is measured by measuring the potential difference across the impedance of the circuit unit.

5. A method of monitoring the operating condition of a lighting system, which system includes a component capable of producing light in response to an alternating current, circuitry connected to conduct alternating current to the component from a primary power source; a secondary power source providing a direct current, an inverter operable to change the direct current from the secondary power source into an alternating current for the component and a circuit connected to conduct alternating current from the inverter to the component, said method comprising:

testing operation of the secondary power source and the inverter by:

operating the inverter to change direct current from the secondary power source to alternating current to the component; and measuring the alternating current being delivered to the component from the inverter; and repeating said testing step periodically, and causing each occurrence of said testing step to have a duration, wherein a plurality of successive occurrences of said testing step each have a duration with a first value and a subsequent occurrence of said testing step has a duration with a second value longer than the first value.

6. A method as defined in claim 5 wherein the secondary power source is rechargeable from the primary power source, and the second duration value approximates the normal continuous operating lifetime of the secondary power source.

7. A method of monitoring the operating condition of a lighting system, which system includes a component capable of producing light in response to an alternating current, circuitry connected to conduct alternating current to the component from a primary power source; a secondary power source providing a direct current, an inverter operable to change the direct current from the secondary power source into an alternating current for the component and a circuit connected to conduct alternating current from the inverter to the component, said method comprising:

testing operation of the secondary power source and the inverter by:

operating the inverter to change direct current from the secondary power source to alternating current to the component; and measuring the alternating current being delivered to the component from the inverter, said method further comprising: determining whether the current measured during said measuring step has a magnitude within a given range; producing a test failure indication when the measured current magnitude is outside the range; manually testing operation of the secondary power source when a test failure indication is produced; and canceling an existing test failure indication when said manually testing step indicates that the alternating current being delivered to the component has a value within a given range.

8. A method of monitoring the operating condition of a lighting system, which system includes a component capable of producing light in response to an alternating current, circuitry connected to conduct alternating current to the component from a primary power source; a secondary power source providing a direct current, an inverter operable to change the direct current from the secondary power source into an alternating current for the component and a circuit connected to conduct alternating current from the inverter to the component, said method comprising:

testing operation of the secondary power source and the inverter by:

operating the inverter to change direct current from the secondary power source to alternating current to the component; and measuring the alternating current being delivered to the component from the inverter, said method further comprising: setting a predetermined time for starting said testing step; determining whether the component is receiving current from the primary power source at the predetermined time; and when it is determined that the component is receiving current from the primary power source at the predetermined time, resetting a time later than the predetermined time for starting said detecting step.

9. A method of monitoring the operating condition of a lighting system, which system includes a component capable of producing light in response to an alternating current, circuitry connected to conduct alternating current to the component from a primary power source; a secondary power source providing a direct current, an inverter operable to change the direct current from the secondary power source into an alternating current for the component and a circuit connected to conduct alternating current from the inverter to the component, said method comprising:

testing operation of the secondary power source and the inverter by:

operating the inverter to change direct current from the secondary power source to alternating current to the component; and measuring the alternating current being delivered to the component from the inverter, wherein the lighting system includes an on-off switch movable between an on position and an off position and connected between the primary power source and the component and operable to control delivery of alternating current to the component from the primary power source, and further comprising, during said testing step, monitoring operation of the switch and terminating said testing step when the switch has been operated between the on position and the off position in a selected switching pattern, and said step of terminating includes setting a subsequent time for restarting said testing step.

10. A method as defined in claim 1 wherein the secondary power source is a source which is recharged by the primary power source when the primary power source is operational, and comprising the further step of monitoring current conducted from the primary power source to the secondary power source and voltage provided by the secondary power source.

11. A method of monitoring the operating condition of a lighting system, which system includes a light producing device capable of producing light in response to an alternating current, circuitry connected to conduct alternating current to the light producing device from a primary power source, a secondary power source providing a direct current, the secondary power source being recharged by the primary power source when the primary power source is operational, an inverter operable to change the direct current from the secondary power source into an alternating current for the light producing device, a circuit unit having an impedance and connected to supply direct current from the secondary power source to the inverter, a circuit connected to conduct alternating current from the inverter to the light producing device, and an on-off switch connected between the primary power source and the light producing device and operable to control delivery of alternating current to the light producing device from the primary power source, said method comprising:

(a) periodically performing a first testing procedure, starting from a predetermined time, for testing operation of the secondary power source and the inverter, by:

(i) preventing the secondary power source from being charged and operating the inverter to change direct current from the secondary power source to alternating current to the light producing device;

(ii) measuring the alternating current being delivered to the light producing device from the inverter, when the inverter is operating, by measuring the potential difference across the impedance of the circuit unit;

(iii) determining whether the current measured during said step of measuring the alternating current has a magnitude within a give range, producing a test failure indication when the measured current magnitude is outside the range, manually testing operation of the secondary power source when a test failure indication is produced, and canceling an existing test failure indication when said manually testing step indicates that the alternating current being delivered to the light producing device has a value within a given range;

(iv) measuring the voltage produced by the secondary power source; and (v) causing each occurrence of said first testing procedure to have a duration, wherein a plurality of successive occurrences of said first testing procedure each have a duration with a first value and a subsequent occurrence of said testing step has a duration with a second value longer than the first value;

(b) determining whether the light producing device is receiving current from the primary power source at the predetermined time, and when it is determined that the light producing device is receiving current from the primary power source prior the predetermined time, resetting a time later than the predetermined time for starting the first testing procedure;

(c) monitoring operation of the switch and, when the switch has been operated in a given manner, terminating said first testing procedure and setting a subsequent time for restarting said first testing procedure; and (d) performing a second testing procedure for monitoring current conducted from the primary power source to the secondary power source and voltage provided by the secondary power source when the secondary power source is being charged by the primary power source.

* * * * *